United States Patent
Shih

(10) Patent No.: US 6,520,851 B1
(45) Date of Patent: Feb. 18, 2003

(54) AIR FAN CONFIGURATION STRUCTURE FOR POWER SUPPLY DEVICE

(76) Inventor: Shoei-Yuan Shih, No. 8, Lane 85, Hsing-I Rd., Pei-Tou Dist., Taipei (TW)

( * ) Notice: Subject to any disclaimer, the term of this patent is extended or adjusted under 35 U.S.C. 154(b) by 0 days.

(21) Appl. No.: 10/040,409

(22) Filed: Jan. 9, 2002

(51) Int. Cl.[7] ................................................. H05K 5/00
(52) U.S. Cl. ................... 454/184; 361/694; 165/104.33
(58) Field of Search .......................... 454/184; 361/694, 361/695; 165/104.33

(56) References Cited

U.S. PATENT DOCUMENTS

| | | | | |
|---|---|---|---|---|
| 4,643,245 A | * | 2/1987 | Smoot et al. ................. | 165/121 |
| 4,744,005 A | * | 5/1988 | Milani .......................... | 361/687 |
| 5,963,424 A | * | 10/1999 | Hileman et al. ............. | 361/695 |
| 6,094,345 A | * | 7/2000 | Diemunsch ................. | 165/80.3 |
| 6,104,607 A | * | 8/2000 | Behl ........................... | 165/80.3 |
| 6,108,203 A | * | 8/2000 | Dittus et al. ................. | 165/122 |
| 6,155,920 A | * | 12/2000 | Pan et al. .................... | 361/695 |
| 6,169,656 B1 | * | 1/2001 | Pei et al. ..................... | 312/236 |
| 6,282,090 B1 | * | 8/2001 | Johnson et al. ............. | 361/687 |
| 6,333,851 B1 | * | 12/2001 | Shih ....................... | 165/104.33 |
| 6,337,795 B1 | * | 1/2002 | Wang .......................... | 361/695 |

* cited by examiner

Primary Examiner—Derek Boles
(74) Attorney, Agent, or Firm—Bacon & Thomas

(57) ABSTRACT

An air fan configuration structure for a power supply device. The structure includes a casing and a lid located on an upper rim of the casing. An air fan may be mounted on the lid to be installed inside the power supply device casing. And the power supply device casing may be installed inside a main processor casing. The air fan can disperse heat generated from elements installed in the power supply device and hardware installed in the main processor casing to ensure normal operations of the hardware and elements.

10 Claims, 7 Drawing Sheets

AIR FAN CONFIGURATION STRUCTURE FOR POWER SUPPLY DEVICE

FIELD OF THE INVENTION

The present invention relates to an improved air fan configuration structure for a power supply device and particularly a configuration structure for deploying an air fan in the interior of a power supply device.

BACKGROUND OF THE INVENTION

Conventional industrial servers now available on the market generally have a disk drive array composed of a plurality of disk drives located inside the server casing. The disk drive array has an air fan array consisting of a plurality of air fans located on a rear end of thereof. Behind the air fan array, there are a plurality of power supply devices to provide power needed for the disk drive array and the air fan array. When the server is under operation, heat generated from the disk drive array is drawn by the air fan array and delivered into power supply device casings, then is discharged out by air fans located on the rear ends of the power supply casings, thereby to achieve heat radiating effect. for the server.

Although the method set forth above can dissipate heat generated by hardware and elements housed in the sever to ensure normal operations of the server hardware and elements, the number of air fan is numerous. As a result, server casing becomes very bulky and heavy, and installation of server also is time-consuming and takes a lot of processes, and production costs are higher.

To resolve aforesaid disadvantages, some producers install air fans on the exterior above power supply devices. This approach may save production of the air fan array and shorten the length of the server, and allows heat generated from the disk drive array be absorbed into power supply device casings, then discharged by air fans located on the rear ends of the power supply devices to achieve heat radiating effect for the server. While installing the air fans on the exterior above the power supply devices may save production of the air fan array and shorten the length of the server, the height of the server increases. As a result, there is no much space spared between the server casing and the upper side of power supply device casings for installing or expanding other hardware facilities or elements.

SUMMARY OF THE INVENTION

The primary object of the invention is to resolve aforesaid disadvantages. The invention installs an air fan in the interior of a power supply device casing to shrink the size of the power supply device. When installed inside the main processor casing, the interior of the main processor casing has sufficient space to install or expand other hardware, or the size of the main processor casing may be shrunk.

Another object of the invention is to provide a simple structure to save installation time and efforts, and to greatly reduce production costs.

To achieve the foregoing objects, the invention includes a lid located on an upper rim of a power supply device casing. The lid may support an air fan so that the air fan may be installed inside the power supply device casing. When the power supply device casing is installed inside a main processor casing, heat generated from inside elements of the power supply device and hardware located in the interior of the main processor is dispersed to ensure normal operations of the hardware and elements.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
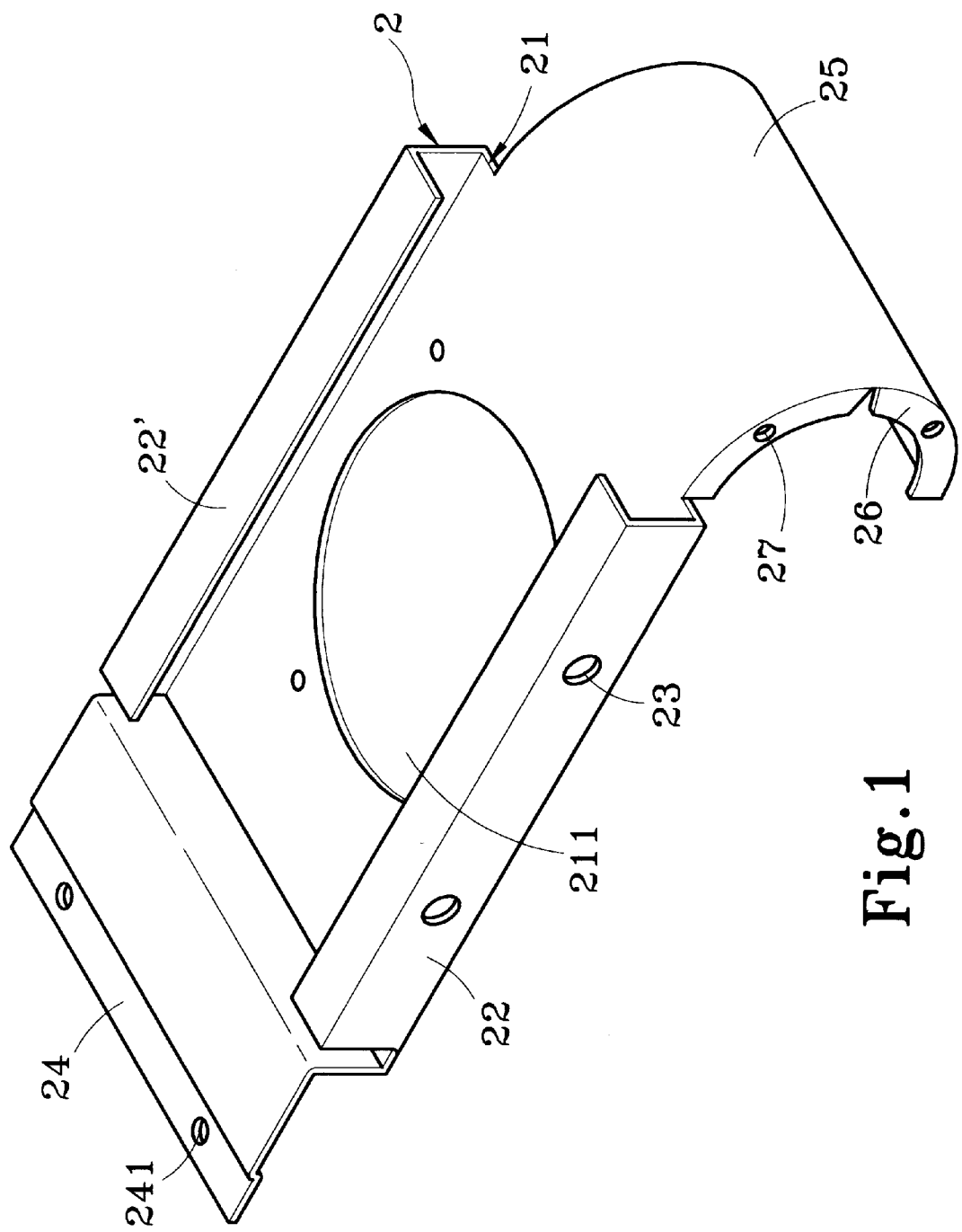
FIG. 1 is a perspective view of a lid of the invention.
Figure 2:
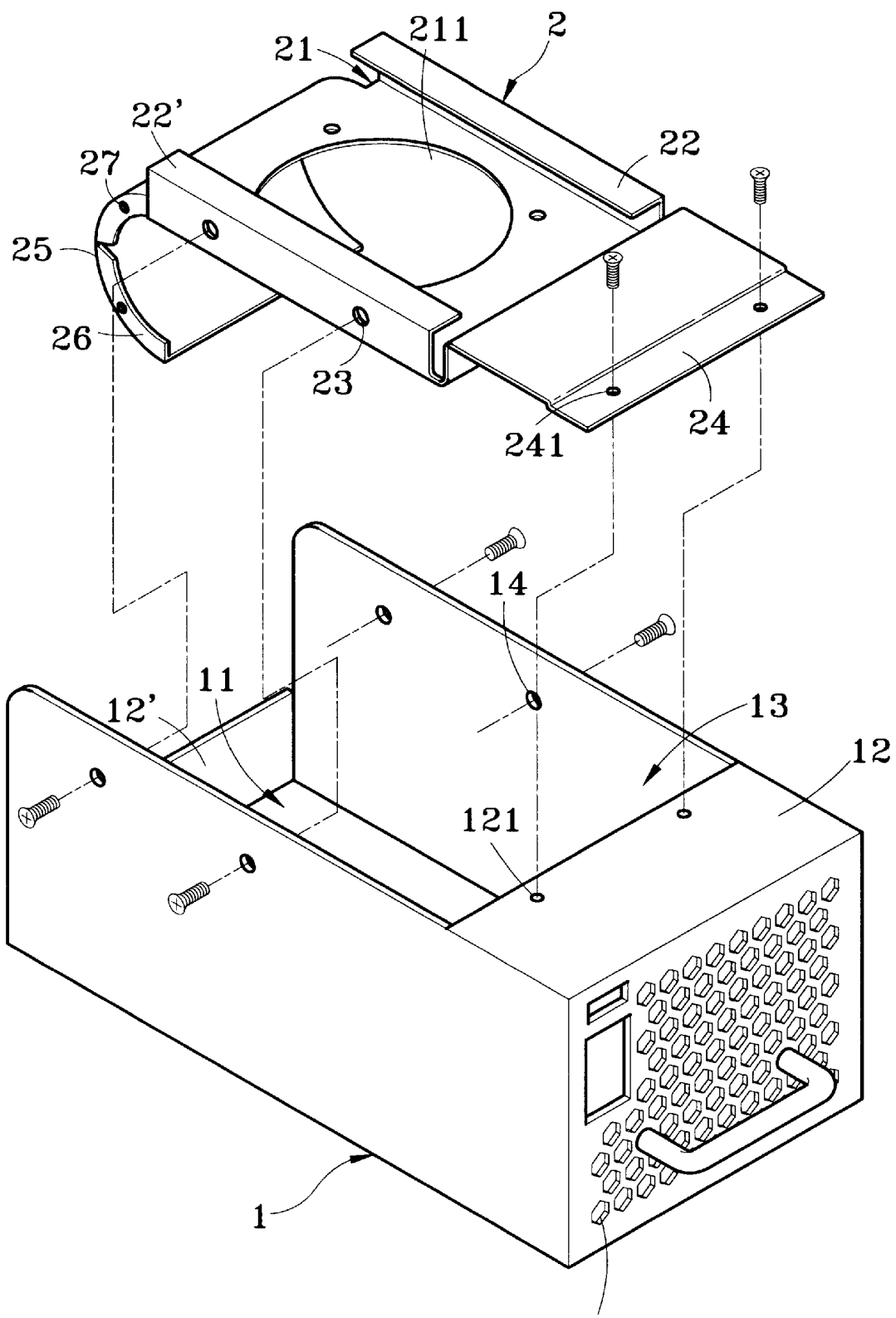
FIG. 2 is an exploded view of a lid and a power supply device casing of the invention.

Referring to FIGS. 1 and 2, the improved air fan configuration structure for a power supply device according to the invention includes a casing 1 and a lid 2 located on an upper rim of the casing 1. After the lid 2 is assembled on the casing 1, an air fan (not shown in the drawings) may be mounted to the lid 2 and held inside the casing 1, so that the size of the casing 1 may be shrunk. The air fan can suck heat generated from hardware mounted on the front end of the casing 1 into the interior of the casing 1, then through the casing 1 to discharge out heat to achieve heat radiating effect.

In the interior of the casing 1, there is a first space 11 for holding circuit boards (not shown in the drawings) and other elements. There is a first extension section 12 located on an upper rim of the first space 11 and a second extension section 12' located on one side of the first space 11. The first extension section 12 has first fastening apertures 121 formed thereon. The extension sections 12, 12' form therebetween a second space 13 for holding the lid 2. The casing 1 has two side walls each has second apertures 14 formed thereon, and one end formed a plurality of heat radiating apertures 15.

The lid 2 is housed in the second space 13 and has a platform 21 for mounting the air fan. The platform 21 has an opening 211 and two sides connecting a pair of symmetrical third extension sections 22, 22'. The third extension sections 22, 22' have third apertures 23 formed thereon to engage with the second apertures 14 located on two sides of the casing 1. The platform 21 has one end extending to form a coupling section 24 which has fourth apertures 241 formed thereon. When the lid 2 is assembled on the casing 1, the coupling section 24 is fastened to the first extension section 12 of the casing. The platform 21 has another end connecting a flow guide 25 for channeling fluid flow direction. The flow guide 25 has two sides connecting two fastening sections 26 which have respectively fifth apertures 27 for engaging with the casing 1. When the lid 2 and the casing 1 are assembled, the flow guide 25 is connected to the second extension section 12'. By means of the construction set forth above, the air fan may be installed inside the casing 1.

The flow guide 25 has a substantially C-shaped cross section, as shown in FIGS. 1–6.

Figure 3:
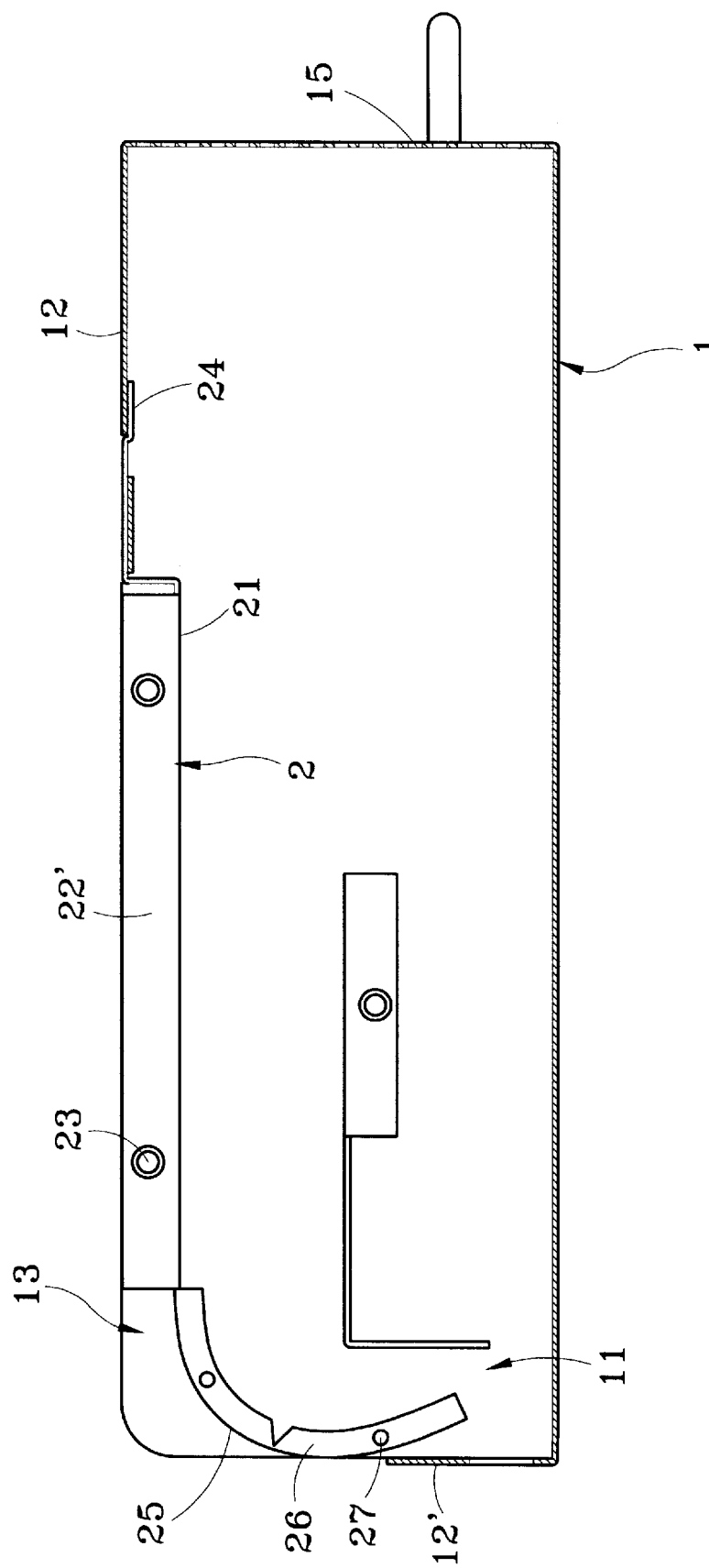
FIG. 3 is a schematic view of a lid and a power supply device casing, assembled.

Referring to FIG. 3 for the lid and the power supply device casing in an assembled condition, when the lid 2 is assembled on the casing 1, the lid 2 is located in the second space 13 of the casing 1 and forms an upper cover of the power supply device casing 1. Hence there is no need to add another support or assembly structure for supporting the air fan (not shown in the drawing). Production is more convenient and easier. And the air fan may also be installed inside the power supply device casing 1.

Figure 4:
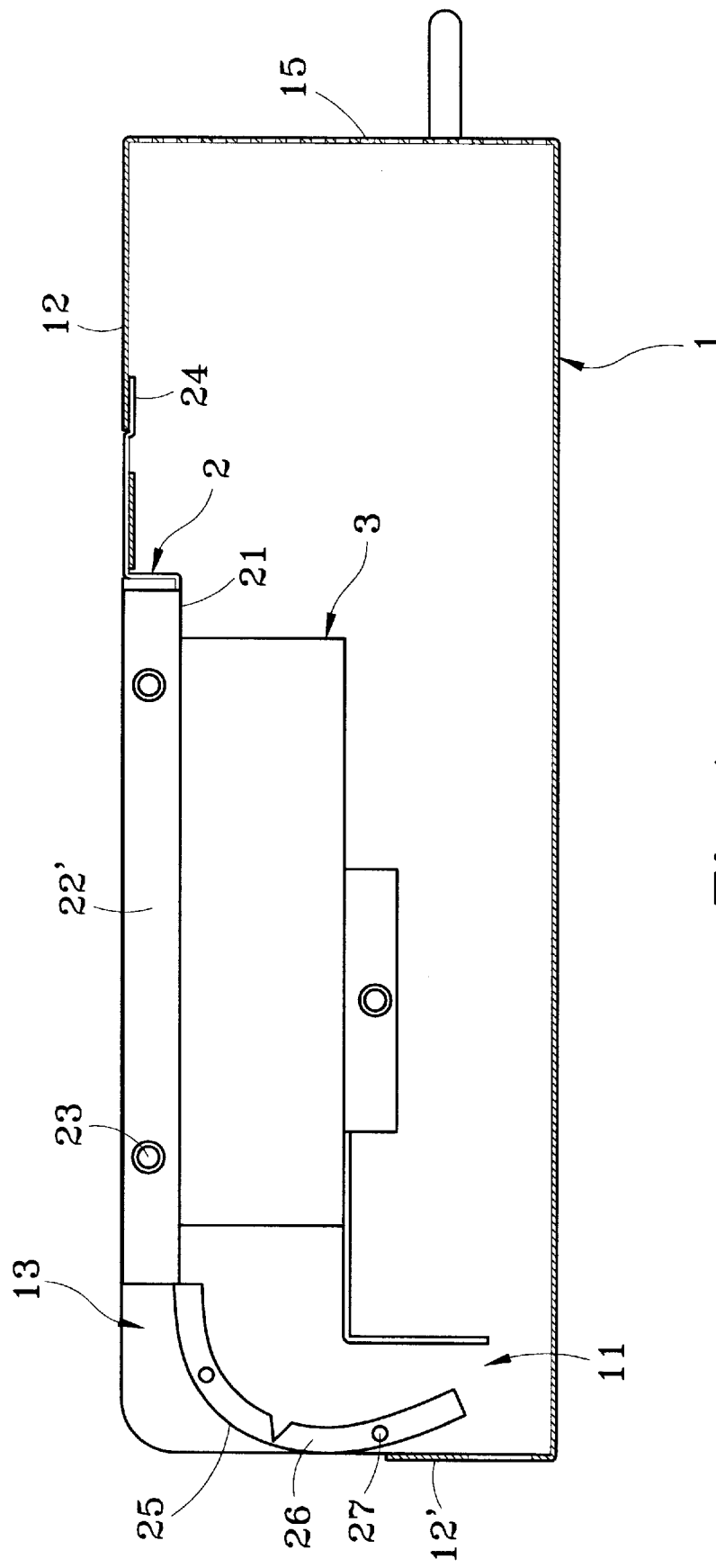
FIG. 4 is a schematic view of a lid and an air fan, assembled.
Figure 5:
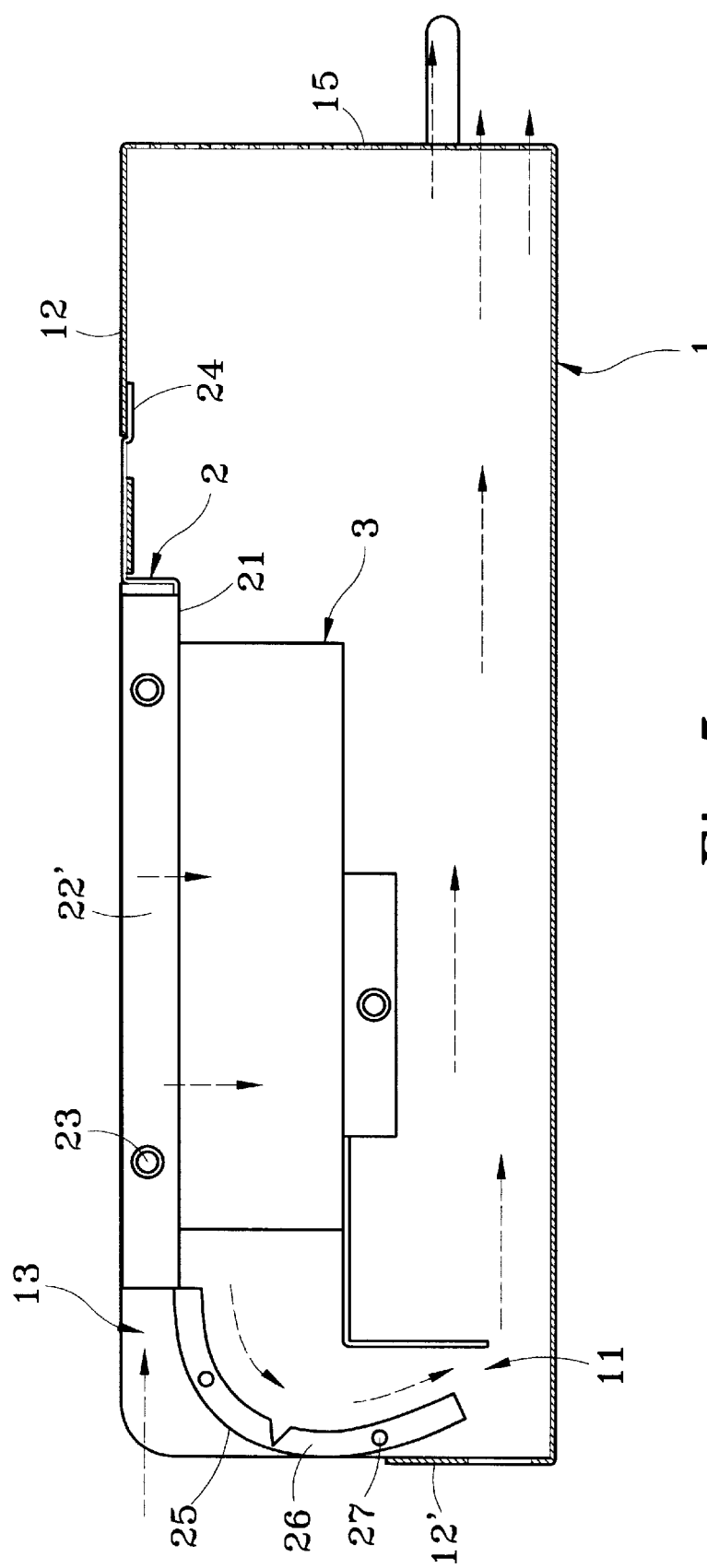
FIG. 5 is a schematic view of fluid flow paths according to the invention.

Referring to FIGS. 4 and 5 for fluid flow paths when the lid and air fan are assembled, after the lid 2 is assembled inside the casing 1, the platform 21 of the lid 2 may anchor and support an air fan 3 thereon (barrel air blower or radial air fan). When the air fan 3 is activated, fluid (air flow) enters from one end of the lid 2, passes through the opening 211 (as the lid 2 has been coupled with other elements, fluid is entered from another side of the flow guide 25). Under the rotation of the air fan 3, fluid is delivered from one end of the air fan 3, along the flow guide 25 into the interior of the casing 1, then through the heat radiating apertures 15 of the casing 1 discharge heat to achieve heat radiating effect.

Figure 6:
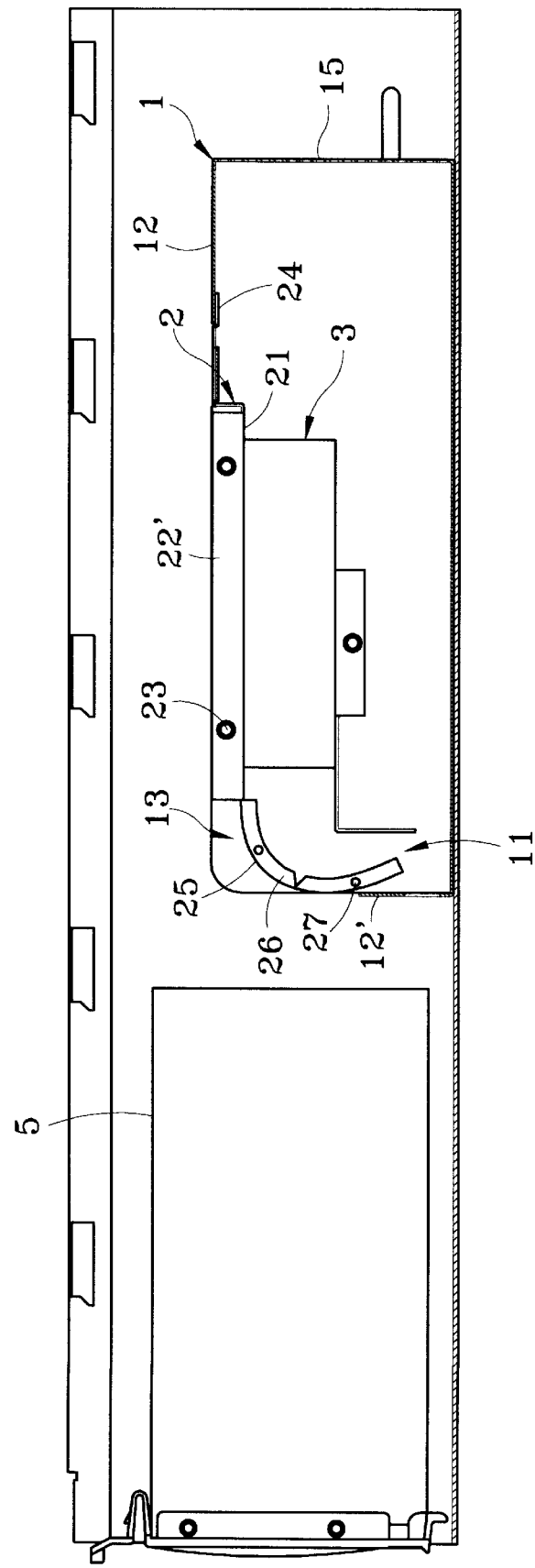
FIG. 6 is a schematic view of the invention in use.

Referring to FIG. 6 for the invention in another use condition, when the air fan 3 is assembled inside the casing 1, the casing 1 is mounted in the interior of a main processor casing 4. When the air fan 3 is activated, heat generated from hardware 5 (such as disk drive array) located on the front end of the casing 1 is drawn into the interior of the casing 1, and heat source fluid is channeled from one end of the lid 2 through the opening 211, and under the direction of rotating air fan blades, flow along the flow guide 25 into the interior of the casing 1 to merge with heat generated from elements in the casing 1, then is discharged through the heat radiating apertures 15 of the casing 1.

Figure 7:
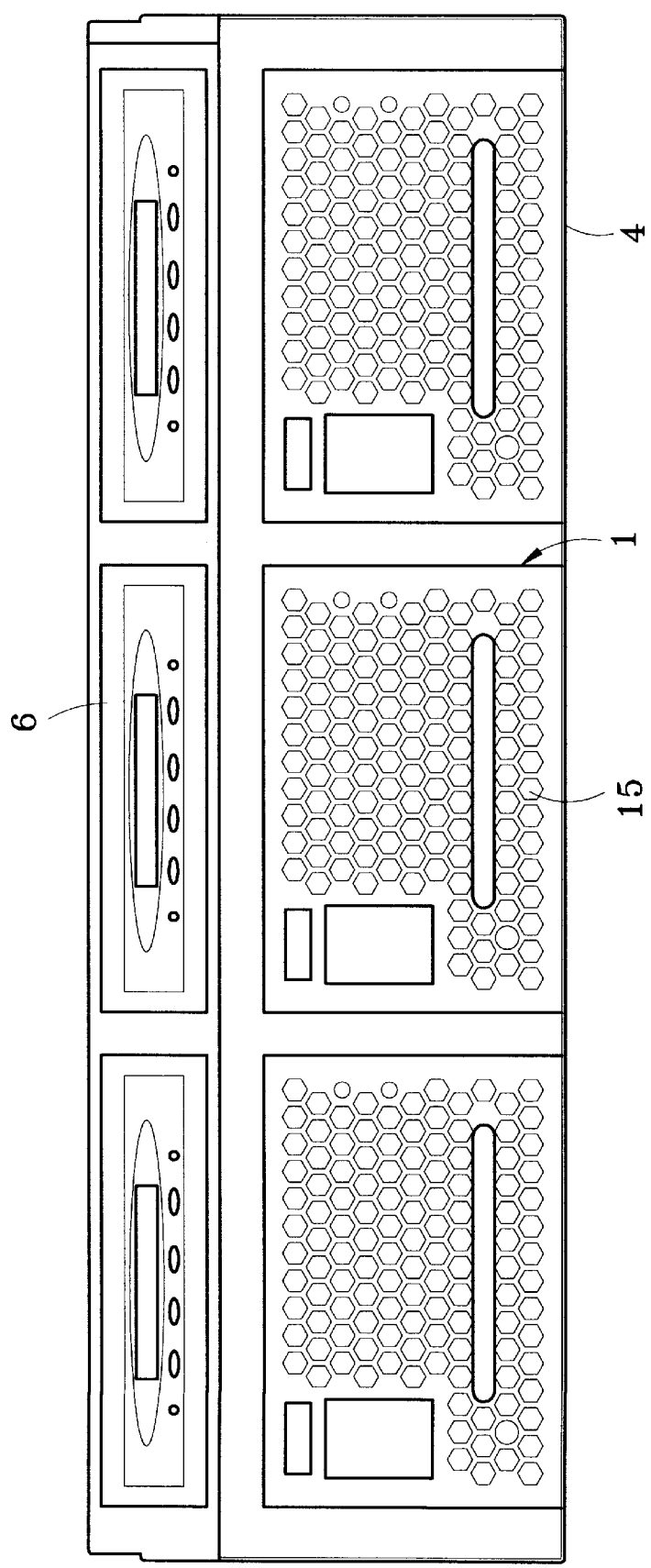
FIG. 7 is a schematic view of another embodiment of the invention.

Referring to FIG. 7 for another embodiment of the invention, after the air fan 3 is assembled inside the casing 1, and the casing 1 is mounted in the main processor casing 4, the space between the upper side of the casing 1 and the main processor casing 4 increases. Hence there are more space available to install other desired equipment or expand required hardware 6 (such as main processor face panels and circuit boards to connect operation panels) to increase operation and control function of the main processor.

Furthermore, once the air fan 3 is assembled inside the casing 1, not only the main processor casing 4 has more space inside for installing other hardware, the main processor casing 4 may also be shrunk to a smaller size.

What is claimed is:

1. An air fan configuration structure for a power supply device adapted to receive an air fan and discharge ambient heat, the structure comprising:

a power supply device casing having a first space in an interior thereof, a first extension section located on an upper rim of the first space and a second extension section located on one side of the first space, the first extension section and the second extension section forming a second space therebetween;

a lid housed in the second space, the lid having a platform adapted for mounting an air fan, the platform having an opening and two sides thereof connecting a pair of symmetrical third extension sections, and one end thereof connecting to a flow guide having a C-shaped cross section; and wherein when an air fan that is mounted on the lid is activated, fluid is drawn into the power supply device casing via the opening, and flows towards the first space and then along the flow guide into the interior of the power supply device casing, and is discharged out from the power supply device casing to dissipate ambient heat.

2. The air fan configuration structure of claim 1, wherein the power supply device casing has two side walls with apertures formed thereon.

3. The air fan configuration structure of claim 1, wherein the power supply device casing has one end thereof which has a plurality of heat radiating apertures formed thereon.

4. The air fan configuration structure of claim 1, wherein either of the first or second extension sections of the casing comprises fastening apertures formed thereon.

5. The air fan configuration structure of claim 1, wherein the third extension sections of the lid have apertures formed thereon.

6. The air fan configuration structure of claim 1, wherein the platform has one side thereof connecting to a coupling section which has apertures formed thereon.

7. The air fan configuration structure of claim 1, wherein the flow guide has two sides thereof connecting a pair of symmetrical fastening sections.

8. The air fan configuration structure of claim 7, wherein the fastening sections have apertures formed thereon.

9. The air fan configuration structure of claim 1, wherein the air fan comprises a radial air fan or a barrel air blower.

10. The air fan configuration structure of claim 1, wherein the power supply device casing is adapted to be installed inside a main processor casing in order to increase space formed between an upper side of the power supply device casing and the main processor casing.

* * * * *